(12) United States Patent
Kim et al.

(10) Patent No.: US 8,681,504 B2
(45) Date of Patent: Mar. 25, 2014

(54) DISPLAY APPARATUS

(75) Inventors: Yeon-Tae Kim, Yongin (KR); Sam-Ju Choi, Yongin (KR); Seung-Jin Lee, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 336 days.

(21) Appl. No.: 13/250,903

(22) Filed: Sep. 30, 2011

(65) Prior Publication Data

US 2012/0099281 A1    Apr. 26, 2012

(30) Foreign Application Priority Data

Oct. 22, 2010 (KR) ........................ 10-2010-0103672

(51) Int. Cl.
*H05K 7/20* (2006.01)
*G09G 3/32* (2006.01)

(52) U.S. Cl.
USPC .............................. 361/719; 361/704; 345/82

(58) Field of Classification Search
None
See application file for complete search history.

(56) References Cited

U.S. PATENT DOCUMENTS

| | | | |
|---|---|---|---|
| 5,319,516 A | 6/1994 | Perkins | |
| 6,086,979 A | 7/2000 | Kanbara et al. | |
| 6,333,603 B1 * | 12/2001 | Juang et al. | 315/169.3 |
| 6,388,722 B1 * | 5/2002 | Yoshii et al. | 349/62 |
| 6,897,919 B2 * | 5/2005 | Enomoto et al. | 349/106 |
| 7,358,532 B2 * | 4/2008 | Nakagawa | 257/59 |
| 7,372,438 B2 * | 5/2008 | Chung et al. | 345/76 |
| 8,416,162 B2 * | 4/2013 | Lee | 345/82 |
| 2004/0160183 A1 * | 8/2004 | Kim | 313/582 |
| 2008/0024714 A1 * | 1/2008 | Park | 349/150 |
| 2009/0091902 A1 | 4/2009 | Kim | |
| 2009/0237907 A1 * | 9/2009 | Kunimoto et al. | 361/818 |

FOREIGN PATENT DOCUMENTS

| | | |
|---|---|---|
| JP | 5-315783 A | 11/1993 |
| JP | 10-22070 A | 1/1998 |
| JP | 11-145676 A | 5/1999 |
| KR | 10-2008-0004728 A | 1/2008 |
| KR | 10-2008-0052730 A | 6/2008 |
| KR | 10-2009-0034596 A | 4/2009 |

\* cited by examiner

*Primary Examiner* — Gregory Thompson
(74) *Attorney, Agent, or Firm* — Knobbe, Martens, Olson & Bear, LLP

(57) ABSTRACT

A display apparatus that facilitates shielding of electromagnetic waves and heat dissipation is disclosed. The display apparatus may include: i) a substrate, ii) a sealing member disposed to face the substrate, iii) a display unit disposed between the substrate and the sealing member, iv) a driving chip disposed on the substrate and transmitting an electric signal to the display unit and v) a circuit board including a signal line that is electrically connected to the driving chip, and a conductive cover layer disposed to cover the driving chip. In one embodiment, the circuit board includes a heat sink for dissipating heat generated by the driving chip.

14 Claims, 3 Drawing Sheets

US 8,681,504 B2

DISPLAY APPARATUS

CROSS-REFERENCE TO RELATED PATENT APPLICATION

This application claims the benefit of Korean Patent Application No. 10-2010-0103672, filed on Oct. 22, 2010, in the Korean Intellectual Property Office, the disclosure of which is incorporated herein in its entirety by reference.

BACKGROUND

1. Field

The described technology generally relates to flat panel displays, and more particularly, to displays that may readily block electromagnetic waves and may facilitate heat dissipation from a driving chip.

2. Description of the Related Technology

With the recently increased interest in displays that employ flat panels, much research has been conducted in relation to different emission technologies. Among the display apparatuses, liquid crystal displays or organic light-emitting displays have drawn particular attention since they can be manufactured as portable thin flat displays.

A display system generally includes a display unit that emits light, and a driving chip that applies electrical signals to the display unit. The signals are generally generated on a flexible circuit board.

SUMMARY

One inventive aspect is a display apparatus that may readily block electromagnetic waves and may facilitate heat dissipation from a driving chip.

Another aspect is a display apparatus including: a substrate; a sealing member disposed to face the substrate; a display unit disposed between the substrate and the sealing member; a driving chip disposed on the substrate and transmitting an electric signal to the display unit; and a circuit board including a signal line that is electrically connected to the driving chip, and a conductive cover layer disposed to cover the driving chip, wherein the circuit board includes a heat dissipating unit that dissipates heat generated by the driving chip.

The display apparatus may further include an insulating layer that insulates the signal wire and the conductive cover layer from each other. The conductive cover layer may include a metal. The conductive cover layer may be spaced apart from the driving chip. The substrate may include an extension unit that extends beyond the sealing member, and the driving chip may be disposed in the extension unit. The display apparatus may further include a protecting layer on the conductive layer, the protecting layer including an insulating material.

DETAILED DESCRIPTION

In a high-resolution display apparatus using high-frequency signals, due to the complicated structure of applying electric signals, electromagnetic waves are generated near a driving chip. These electromagnetic waves may cause the driving chip to generate heat, which may damage other components near the driving chip and degrade image quality.

Embodiments will now be described more fully with reference to the accompanying drawings.

Figure 1:
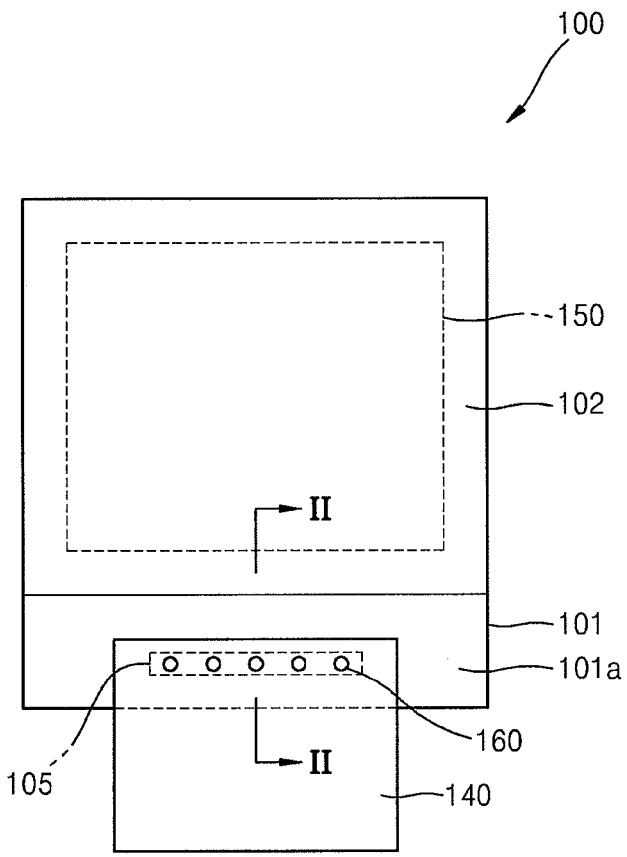
FIG. 1 is a schematic plan view of a display apparatus according to an embodiment.
Figure 2:
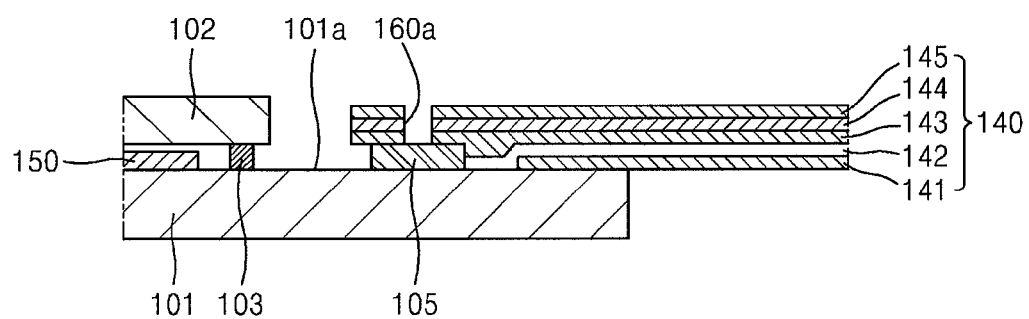
FIG. 2 is a cross-sectional view taken along line II-II of FIG. 1.

FIG. 1 is a schematic plan view of a display apparatus 100 according to an embodiment. FIG. 2 is a cross-sectional view taken along line II-II of FIG. 1.

Referring to FIGS. 1 and 2, the display apparatus 100 includes a substrate 101, a sealing member 102, a display unit 150, a driving chip 105, and a circuit board 140.

The substrate 101 may include a transparent glass material containing $SiO_2$ as a main component. The substrate 101 may include, but is not limited to, a transparent plastic material. The plastic material for forming the substrate 101 may include an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

The sealing member 102 is disposed on the substrate 101. The sealing member 102, which may protect the display unit 150 from external moisture or oxygen, may have an alternating structure of multiple layers including glass and plastic, or organic and inorganic materials. The sealing member 102 may include a material that is the same as that of the substrate 101.

An extension unit 101a extends beyond the sealing member 102 on a side of the substrate 101. Signal interconnects (not shown) that are electrically connected to the display unit 150 may be disposed on the extension unit 101a.

The display unit 150 is arranged between the substrate 101 and the sealing member 102, which are bound together by a sealant 103. If the sealing member 102 has a thin film structure of alternating organic and inorganic materials, the sealing member 102 may be directly bound to the substrate 101 without using the sealant 103.

The driving chip 105 may be disposed on the extension unit 101a. The driving chip 105 may transmit an electric signal to the display unit 150. The driving chip 105 may be a driver IC. The driving chip 105 includes an output pin (not shown) and an input pin (not shown) via which the signal interconnects on the extension unit 101a are electrically connected to the driving chip 105. The driving chip 105 is electrically connected to the display unit 150 via the signal interconnects of the extension unit 1010. The driving chip 105 and the signal interconnects of the extension unit 101a may be connected by, for example, an anisotropic conductive film (ACF).

The circuit board 104 is disposed on the substrate 101 to be electrically connected to one end of the driving chip 105. The circuit board 140 may transmit an external driving signal to the driving chip 105. The circuit board 140 may include a material that provides flexibility so that the circuit board 140 can bend to reach a rear surface of the substrate 101.

The circuit board 140 may be a flexible circuit board. The circuit board 140 may include a signal wire 142, a conductive cover layer 144, and a heat dissipating unit 160. The signal wire 142 may be connected to the driving chip 105 to transmit a signal to the driving chip 105. The signal wire 142 may be arranged on a base film 141. The base film 141, which may be formed of an insulating, flexible material, protects the signal wire 142. The base film 141 may enhance the overall durability of the circuit board 140.

An insulating layer 143 is disposed on the signal wire 142. The signal wire 142 and the conductive cover layer 144 may be insulated from each other by the insulating layer 143. The insulating layer 143 may include any of various insulating materials.

The conductive cover layer 144 may be disposed on the signal wire 142 to extend beyond the signal wire 142. The conductive cover layer 144 may extend to substantially entirely cover the driving chip 105. In one embodiment, the conductive cover layer 144 extends to be spaced apart from the driving chip 105. The conductive cover layer 144 may include any of various conductive materials. In one embodiment, the conductive cover layer 144 includes a metal in consideration of conductivity, flexibility, and durability.

Electromagnetic waves are generated around the driving chip 105 due to electrical signals. In particular, in the case of a high-resolution image display, the display apparatus 100 may need to process great amounts of data, and thus, may use high-frequency electric signals. High-frequency signals may cause generation of many electromagnetic waves near the driving chip 105.

In one embodiment, the conductive cover layer 144 is disposed to cover the driving chip 105. The conductive cover layer 144 may shield the electromagnetic waves generated around the driving chip 105. That is, the conductive cover layer 144 may serve as a kind of ground to reduce the electromagnetic waves.

As a result, degradation in image quality caused due to the electromagnetic waves may be prevented. Also, damage of components of the display apparatus 100 due to heat generated from the electromagnetic waves damages may be prevented.

Furthermore, the conductive cover layer 144, which is disposed to cover the driving chip 105, may protect the driving chip 105 from being damaged by an external impact.

A protecting layer 145 containing an insulating material may be further disposed on the conductive cover layer 144.

The circuit board 140 may further include the heat dissipating unit 160. The heat dissipating unit 160 may externally dissipate the heat generated by the driving chip 105. The heat dissipating unit 160 may include at least one hole 160a that penetrates through opposite surfaces of the circuit board 140. The hole 160a may penetrate through the insulating layer 143, the conductive cover layer 144, and the protecting layer 145. The hole 160a may correspond to the driving chip 105 to externally expose a portion of the driving chip 105. Consequently, the heat generated by the driving chip 105 may be readily externally dissipated through the hole 160a.

Figure 3:
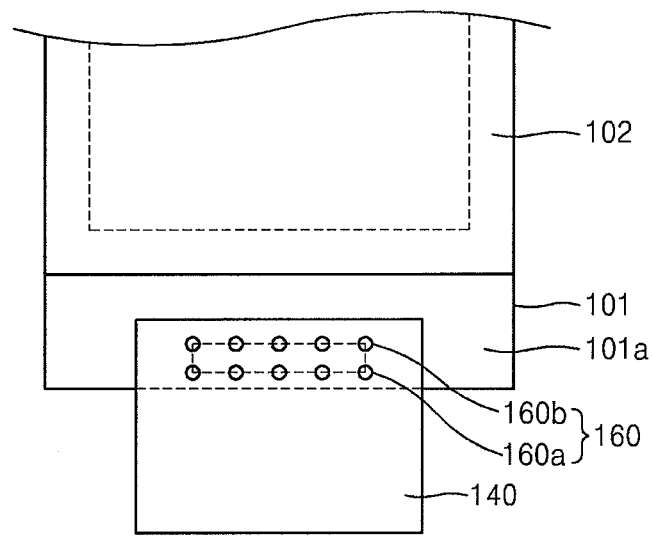
FIG. 3 is a schematic plan view of a display apparatus according to another embodiment.

FIG. 3 is a schematic plan view of a display apparatus according to another embodiment. Referring to FIG. 3, the heat dissipating unit 160 may include a plurality of holes 160a and 160b arranged in two rows. At least two rows of holes may be arranged in the heat dissipating unit 160.

Figure 4:
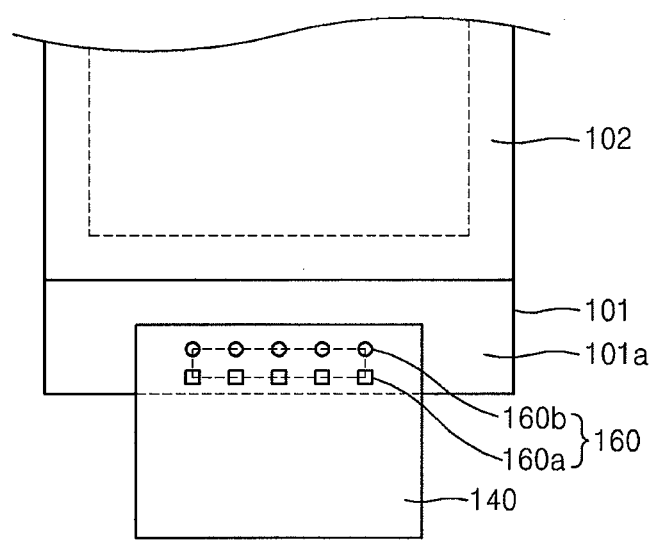
FIG. 4 is a schematic plan view of a display apparatus according to another embodiment.

FIG. 4 is a schematic plan view of a display apparatus according to another embodiment. Referring to FIG. 4, the heat dissipating unit 160 may include a plurality of holes 160a and 160b having different shapes. For examples, the holes 160a may have a substantially circular shape, while the holes 160b may have a substantially rectangular or square shape. Alternatively, a plurality of holes having various other polygonal shapes may be arranged in the heat dissipating unit 160.

Figure 5:
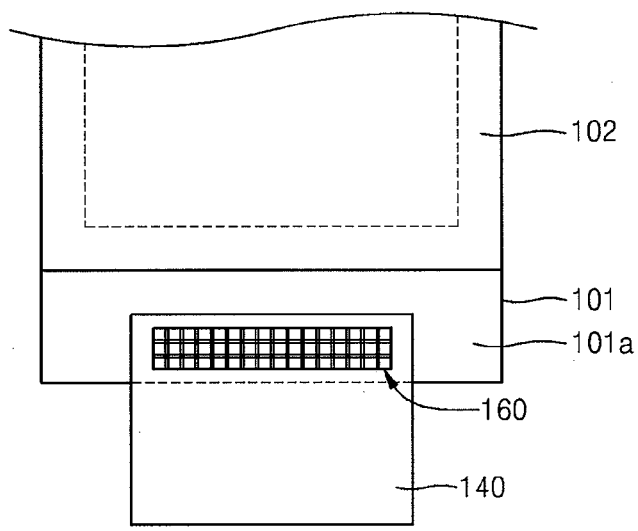
FIG. 5 is a schematic plan view of a display apparatus according to another embodiment.

FIG. 5 is a schematic plan view of a display apparatus according to another embodiment. Referring to FIG. 5, the heat dissipating unit 160 may have a mesh structure.

Figure 6:
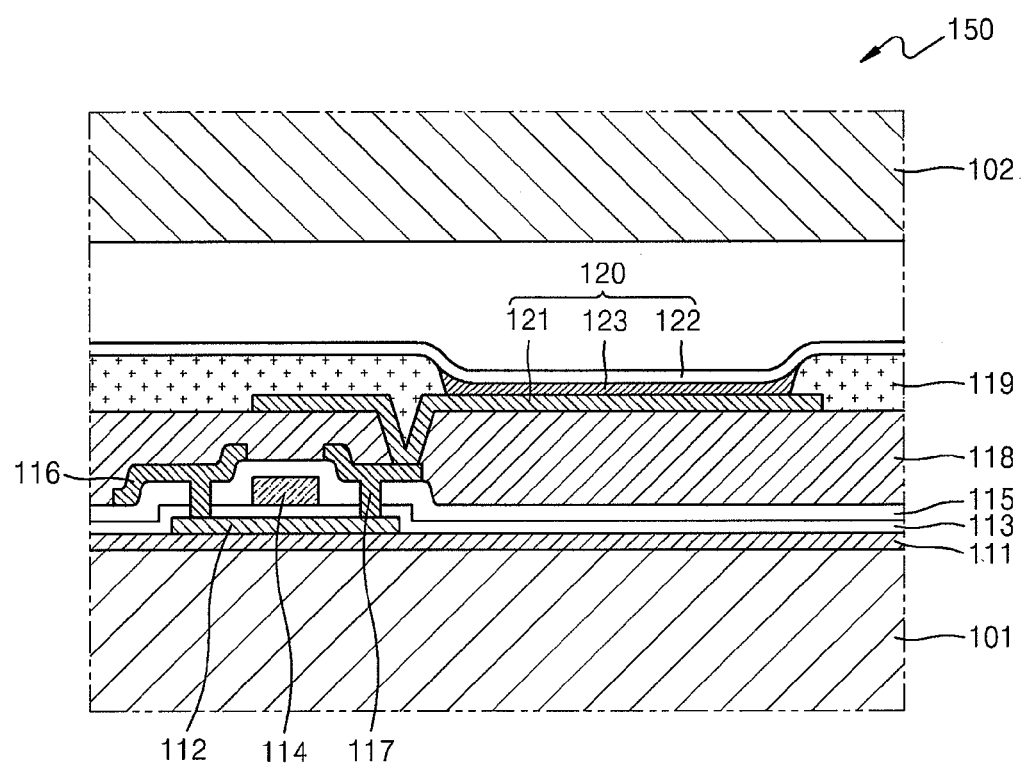
FIG. 6 is a cross-sectional view of a display unit in FIG. 1, according to an embodiment.

FIG. 6 is a cross-sectional view of the display unit 150 in FIG. 1, according to an embodiment. In one embodiment, the display unit 150 of the display apparatus 100 includes an organic light-emitting device. In another embodiment, the display unit 150 includes a liquid crystal display device.

A structure of the display unit 150 will now be described in detail with reference to FIG. 6. Referring to FIG. 6, one organic light-emitting device 120 is disposed between the substrate 101 and the sealing member 102. Although only one organic light-emitting device 120 is illustrated in FIG. 6 for convenience of explanation, the display unit 150 may include a plurality of organic light-emitting devices 120.

A buffer layer 111 is disposed on the substrate 101. The buffer layer 111 may be disposed to planarize an upper surface of the substrate 101 and prevent moisture and foreign materials from permeating into the substrate 101. An active layer 112 having a predetermined pattern is disposed on the buffer layer 111. The active layer 112 may include an inorganic semiconductor material, such as amorphous silicon or polysilicon, or an organic semiconductor material. The active layer 221 may include a source region, a drain region, and a channel region between the source and drain regions.

The source and drain regions may be formed by doping the active layer 112 formed of an amorphous silicon or polysilicon with impurities. A Group 3 element, for example, boron (B), may be doped to form a P-type semiconductor. A Group 5 element, for example, nitrogen (N), may be doped to form a N-type semiconductor.

A gate insulating layer 113 is disposed on the active layer 112, and a gate electrode 114 is disposed in a predetermined region of the gate insulating layer 113. The gate insulating layer 113, which insulates the active layer 112 and the gate electrode 114 from each other, may include an organic material, or an inorganic material, for example $SiN_x$, or $SiO_2$.

The gate electrode 114 may include a metal or a metal alloy, for example, selected from among gold (Au), silver (Ag), copper (Cu), nickel (Ni), platinum (Pt), palladium (Pd), aluminum (Al), molybdenum (Mo), Al:Nd, and Mo:W. However, the material of the gate electrode 114 is not limited thereto, and various appropriate materials may be used in consideration of adhesion, flatness, electric resistance, processability, and the like. The gate electrode 114 is connected to a gate line (not shown) that applies an electric signal.

An interlayer insulating layer 115 is disposed on the gate electrode 114. The interlayer insulating layer 115 and the gate insulating layer 113 may be formed to expose the source and drain regions of the active layer 112. A source electrode 116 and a drain electrode 117 are disposed to contact the exposed regions of the active layer 112.

The source electrode 116 and the drain electrode 117 may each independently include a metal or an alloy of at least two metals, for example, may each include, but not limited to, among gold (Au), palladium (Pd), platinum (Pt), nickel (Ni), rhodium (Rh), ruthenium (Ru), iridium (Ir), osmium (Os), aluminum (Al), molybdenum (Mo), an Al:Nd alloy, or an MoW alloy.

A passivation layer 118 is disposed to cover the source electrode 116 and the drain electrode 117. The passivation layer 118 may include at least one of an inorganic insulating layer and an organic insulating layer. The inorganic insulating layer may include at least one $SiO_2$, SiNx, SiON, $Al_2O_3$, $TiO_2$, $Ta_2O_5$, $HfO_2$, $ZrO_2$, BST, or PZT. The organic insulating layer may include at least one a common polymer for example, polymethylmethacrylate (PMMA) or polystyrene (PS), a polymer derivative having a phenol group, an acryl-based polymer, an imide-based polymer, an acrylether-based polymer, an amide-based polymer a fluorine-based polymer, a p-xylene-based polymer, a vinylalcohol-based polymer, or a blend thereof. The passivation layer 118 may include a composite stack of an inorganic insulating layer and an organic insulating layer.

The passivation layer 118 may be formed to expose the drain electrode 117, and the organic light-emitting device 120 is disposed to be connected to the exposed drain electrode 117. The organic light-emitting device 120 may include a first electrode 121, a second electrode 122, and an intermediate layer 123. In particular, the first electrode 121 may contact the drain electrode 117.

The intermediate layer 123 may include an organic emission layer, and may emit visible light when a voltage is applied between the first electrode 121 and the second electrode 122.

A pixel define layer 119 that includes an insulating material may be disposed on the first electrode 121. The pixel define layer 119 may be formed to have a predetermined opening that exposes the first electrode 121. The intermediate layer 123 is disposed on the exposed first electrode 121. The second electrode 122 is disposed to contact the intermediate layer 123.

The first electrode 121 and the second electrode 122 may function, respectively, as an anode and a cathode. Alternatively, the first electrode 121 and the second electrode 122 may function, respectively, as a cathode and an anode. The sealing member 102 is disposed on the second electrode 122.

As described above, according to at least one of the disclosed embodiments, the conductive cover layer 144 is disposed to cover the driving chip 105, thereby facilitating shielding of the electromagnetic waves generated around the driving chip 105, and thus, improving image quality of the display apparatus 100 and preventing the components from damaging. The conductive cover layer 144 may prevent the driver chip 105 from damaging due to external pressure or foreign materials.

Furthermore, a display apparatus may facilitate blocking of electromagnetic waves and externally dissipating heat generated in a driving chip.

While embodiments have been shown and described with reference to the accompanying drawings, it will be understood by those of ordinary skill in the art that various changes in form and details may be made therein without departing from the spirit and scope of the following claims.

What is claimed is:

1. A display apparatus comprising:
   a substrate;
   a sealing member disposed to face the substrate;
   a display unit disposed between the substrate and the sealing member;
   a driving chip disposed on the substrate and configured to transmit an electric signal to the display unit; and
   a circuit board comprising i) a signal line that is electrically connected to the driving chip, and ii) a conductive cover layer disposed to cover the driving chip,
   wherein the circuit board comprises a heat dissipating unit configured to dissipate heat generated by the driving chip.

2. The display apparatus of claim 1, further comprising an insulating layer that insulates the signal wire and the conductive cover layer from each other.

3. The display apparatus of claim 2, wherein the insulating layer at least partially covers the driving chip, and wherein the heat dissipating unit penetrates the insulating layer and the conductive cover layer to dissipate the heat generated by the driving chip to the environment.

4. The display apparatus of claim 1, wherein the conductive cover layer comprises a metal.

5. The display apparatus of claim 1, wherein the conductive cover layer is spaced apart from the driving chip.

6. The display apparatus of claim 1, wherein the substrate comprises an extension unit that extends beyond the sealing member, and wherein the driving chip is disposed in the extension unit.

7. The display apparatus of claim 1, further comprising a protecting layer formed on the conductive layer, wherein the protecting layer comprises an insulating material.

8. The display apparatus of claim 7, wherein the protecting layer at least partially covers the driving chip, and
   wherein the heat dissipating unit penetrates the protecting layer and the conductive cover layer to expose a portion of the driving chip.

9. The display apparatus of claim 1, wherein at least two holes, penetrating opposite surfaces of the circuit board, are formed in the heat dissipating unit.

10. The display apparatus of claim 9, wherein the at least two holes expose a portion of the driving chip.

11. The display apparatus of claim 9, wherein the heat dissipating unit is disposed on the driving chip.

12. The display apparatus of claim 1, wherein the heat dissipating unit has a mesh structure and is disposed on the driving chip.

13. The display apparatus of claim 1, wherein the circuit board comprises a flexible circuit board.

14. The display apparatus of claim 1, wherein the display unit is an organic light-emitting diode or a liquid crystal display.

* * * * *